United States Patent [19]

Choi

[11] Patent Number: 5,455,198
[45] Date of Patent: Oct. 3, 1995

[54] METHOD FOR FABRICATING TUNGSTEN CONTACT PLUG

[75] Inventor: Kyeong K. Choi, Kyoungki, Rep. of Korea

[73] Assignee: Hyundai Electronics Industries Co., Ltd., Rep. of Korea

[21] Appl. No.: 174,880

[22] Filed: Dec. 27, 1993

[30] Foreign Application Priority Data

Dec. 31, 1992 [KR] Rep. of Korea ................ 1992-27092

[51] Int. Cl.$^6$ .............................................. H01L 21/441
[52] U.S. Cl. .......................... 437/192; 437/24; 437/195; 148/DIG. 17
[58] Field of Search ............................ 437/192, 24, 194, 437/195; 148/DIG. 17

[56] References Cited

U.S. PATENT DOCUMENTS

| | | | |
|---|---|---|---|
| 4,746,621 | 5/1988 | Thomas et al. | 437/24 |
| 4,902,645 | 2/1990 | Ohba | 437/192 |
| 4,954,214 | 9/1990 | Ho | 156/657 |
| 5,176,790 | 1/1993 | Arleo et al. | 156/64.3 |
| 5,231,054 | 7/1993 | Kosugi | 437/192 |
| 5,258,329 | 11/1993 | Shibata | 437/194 |
| 5,305,519 | 4/1994 | Yamamoto et al. | 437/192 |
| 5,312,518 | 5/1994 | Kadomura | 156/643 |

FOREIGN PATENT DOCUMENTS

| | | |
|---|---|---|
| 63205930 | 8/1988 | Japan. |
| 63260053 | 10/1988 | Japan. |
| 2144917 | 6/1990 | Japan ................ 437/192 |
| 2203531 | 8/1990 | Japan. |

OTHER PUBLICATIONS

Wolf et al., Silicon processing for the VLSI vol. I, pp. 543–555, 1986.

Primary Examiner—Brian E. Hearn
Assistant Examiner—Michael Trinh
Attorney, Agent, or Firm—Merchant, Gould, Smith, Edell, Welter & Schmidt

[57] ABSTRACT

A method for fabricating a contact plug capable of achieving a smooth tungsten growth by implanting silicon ions in the bottom surface of a via contact hole not only to remove a polymer formed on the bottom surface of the via contact hole, but also to provide a seed layer for the tungsten growth, and capable of preventing an adverse effect on the contact resistance resulting from a formation of $AlF_3$ due to a direct contact between Al and $WF_6$. The method includes the steps of forming a first oxide film, depositing a first metal layer on the first oxide film, forming a second oxide layer over the first metal layer, and etching a predetermined portion of the second oxide layer to form a via contact hole through which the first metal layer is partially exposed, implanting silicon ions in the bottom surface of the via contact hole to remove a fluorine-based polymer formed on the via contact hole bottom surface at the step of forming the via contact hole, depositing tungsten to form a tungsten plug buried in the via contact hole, and depositing a second metal layer over the entire exposed surface of the resulting structure so that the second metal layer can be in contact with the first metal layer via the tungsten plug.

5 Claims, 3 Drawing Sheets

METHOD FOR FABRICATING TUNGSTEN CONTACT PLUG

BACKGROUND OF THE INVENTION

1. Field of the Invention

The present invention relates to a method for fabricating a contact plug in a highly integrated semiconductor device, and more particularly to a method for fabricating a tungsten contact plug buried in a via contact hole for a connection among metal layers of a multilayer structure.

2. Description of the Prior Art

Contact plugs made of aluminum alloy are well-known. In semiconductor devices with a higher integrity, however, such contact plugs encounter a variety of problems because the coverage of the aluminum alloy are poorer. For solving such problems, there has been proposed a method for fabricating a contact plug by a selective deposition of a tungsten layer. In accordance with this method, a tungsten layer is selectively deposited over an aluminum alloy layer at a high temperature of no less than 400° C. by use of a reacting gas consisting of $WF_6$, $SiH_4$ and $H_2$. When tungsten (W) is grown over aluminum alloy, the aluminum and the $WF_6$ gas react with each other at an interface between Al and W, thereby producing $AlF_3$ adversely affecting the contact resistance, as expressed by the following equation (1):

$$Wf_6 + 2Al \rightarrow W + 2AlF_3 \tag{1}$$

On the other hand, a reacting gas used upon forming a via contact hole includes a fluorine (F)-based chemical material such as $CHF_3$, $CF_3$ or $O_2$. By such chemical material, an F-based polymer may be formed on the Al surface. When Al alloy is deposited, the F-based polymer forms voids which make it difficult to achieve a subsequent W deposition.

Where a tungsten contact plug is formed in a structure including a first metal layer made of aluminum alloy, a second metal layer made of both an aluminum alloy and an insulating film comprised of a spin-on-glass (SOG) film, gas is generated from the SOG film at the interface between W and Al during the W deposition for the contact plug. The gas may penetrate the interface between w and Al and adversely affect the contact resistance. Such gas-generating phenomenon is sensitive to temperature and becomes more active at a higher temperature of, for example, not less than 250° C.

SUMMARY OF THE INVENTION

Therefore, an object of the invention is to solve the abovementioned problems encountered in the prior art and to provide a method for fabricating a contact plug capable of achieving a smooth tungsten growth by implanting silicon ions in the bottom surface of a via contact hole not only to remove a polymer formed on the bottom surface of the via contact hole, but also to provide a seed layer for the tungsten growth, and capable of preventing an adverse effect on the contact resistance resulted from a formation of $AlF_3$ due to a direct contact between Al and $WF_6$.

In order to accomplish this object, the present invention utilizes an implantation of silicon ions such as $Si^{28}$ in an aluminum alloy surface of a via contact hole so as to inhibit a formation of $AlF_3$ resulting from a reaction between $WF_6$ and Al in formation of the tungsten contact plug and remove a fluorine (F)-based film (polymer) formed in the bottom surface of the via contact hole in formating of the via contact hole. This is because the Si ions dissolve the F-based film by its physical impact against the F-based film under a condition that the energy used for the $Si^{28}$ implantation and the dose of implanted $Si^{28}$ are properly adjusted. Even though a reaction of $WF_6$ is subsequently carried out, the silicon ions implanted in the aluminum layer prevents the aluminum layer from coming into contact with $WF_6$, thereby inhibiting a production of $AlF_3$. Thus, the contact resistance can be reduced.

The silicon layer deposited by virtue of the implantation of silicon ions reacts with a reacting gas of $WF_6$ at a W deposition step, thereby providing a seed layer for the W growth. The reaction between Si and $WF_6$ is carried out as expressed by the following equation (2):

$$2WF_6 + 3Si - 2W + 3SiF_4 \tag{2}$$

The reacting gas $WF_6$ is subsequently reduced by $H_2$ or $SiH_4$ for deposition to a required thickness. By utilizing the abovementioned Si implantation, it is possible to reduce the latent time for W growth on the Al layer and achieve the reaction between Si and $WF_6$ at a low temperature. As a result, it is possible to inhibit a generation of gas from the temperature-sensitive SOG film constituting the insulating film.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

FIGS. 1 to 5 are sectional views respectively illustrating a method for fabricating a contact plug in accordance with the present invention.

Figure 1:
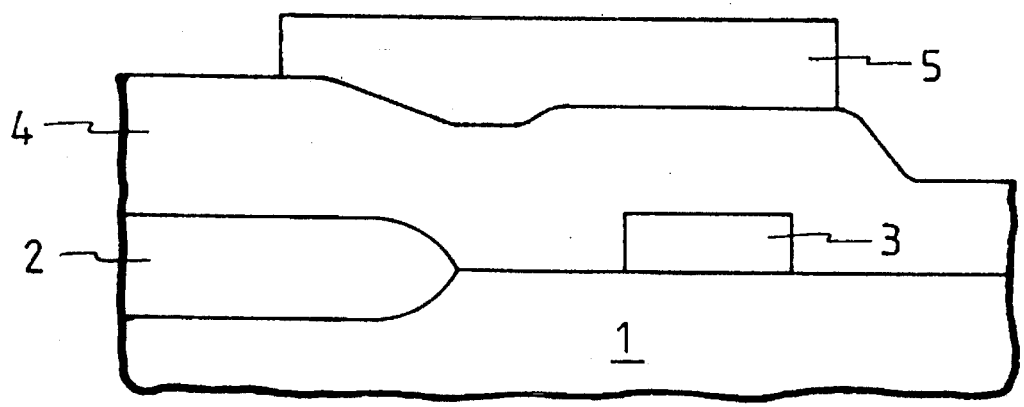
FIGS. 1 to 5 are sectional views respectively illustrating a method for fabricating a contact plug in accordance with the present invention.

In accordance with this method, an inter-device isolation insulating film 2 is formed on a substrate 1 to have a predetermined dimension, as shown in FIG. 1. A polysilicon pattern 3 is also formed on the substrate 1. Over the entire exposed surface of the resulting structure, a first oxide film 4 is then formed. Thereafter, a first metal layer 5 comprised of, for example, an Al alloy layer is deposited over the first oxide film 4. The first metal layer 5 is then patterned by use of an etching process.

Figure 2:
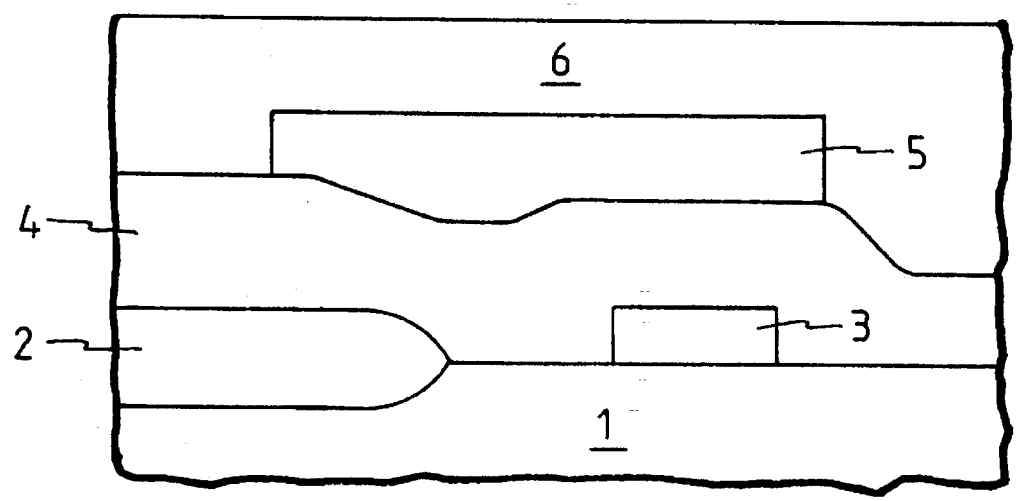

Then, a second oxide film 6 is formed over the entire exposed surface of the resulting structure, as shown in FIG. 2. The second oxide film 6 is comprised of an inter metal oxide (IMO) film or a spin-on-glass (SOG) film. In case of the IMO film, it is deposited to a thickness of about 2,000 Å using a reacting gas of tetra ethyl ortho silicate (TEOS) in a plasma enhanced chemical vapor deposition (PECVD) reactor. In case of the SOG film, it is deposited to a thickness of about 6,000 Å using a spin coater. In either case, the deposited film is subsequently subjected to a curing at 400° C.

Figure 3:
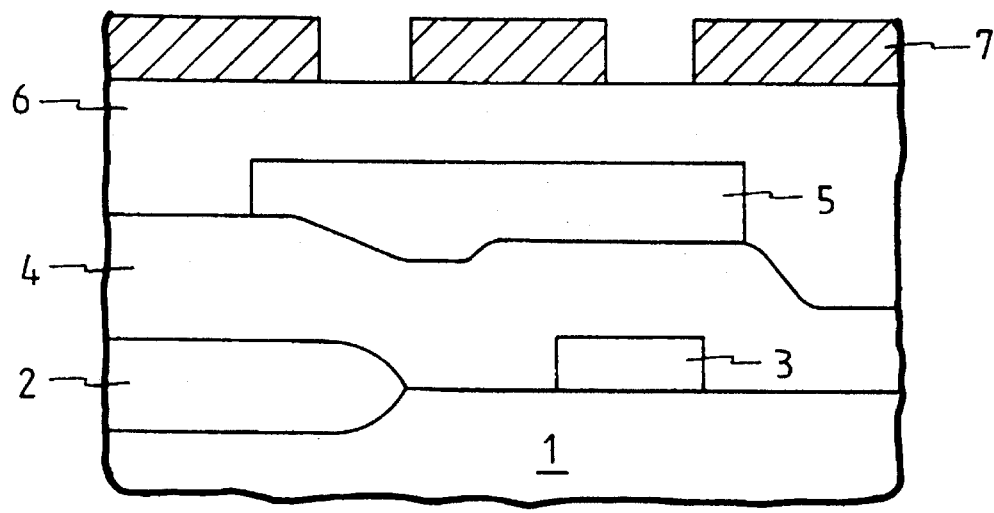
Figure 4:
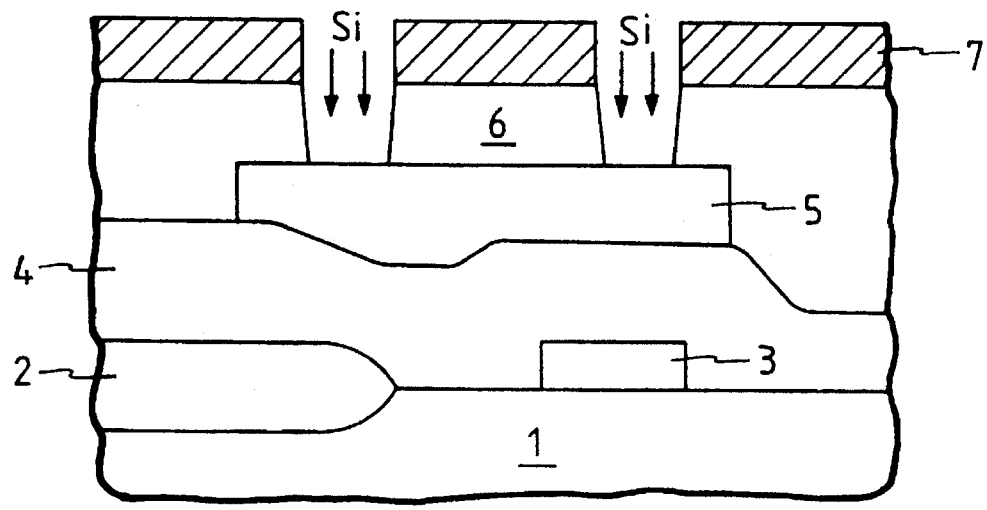

Thereafter, a photoresist film pattern 7 is formed on the second oxide film 6 using a contact mask not shown, as shown in FIG. 3. Using the photoresist film pattern 7 as a mask, the second oxide film 6 is partially etched at its portion exposed through the photoresist film pattern 7 in a reaction ion etching (RIE) reactor containing a reacting gas having a chemical composition consisting of $CHF_3$, $CF_4$ and $O_2$, thereby forming via contact holes, as shown in FIG. 4. Subsequently, silicon ions are implanted in portions of the first metal layer 5 respectively exposed through the via contact holes. The implantation is performed under a condition of using an energy of 20 to 30 Kev and a dose of $10^{14}$ to $10^{15}$ Ions/cm$^2$. The implantation of Si ions should be achieved under the minimum energy condition so as to minimize the possible damage of the exposed first metal layer in implantation.

Figure 5:
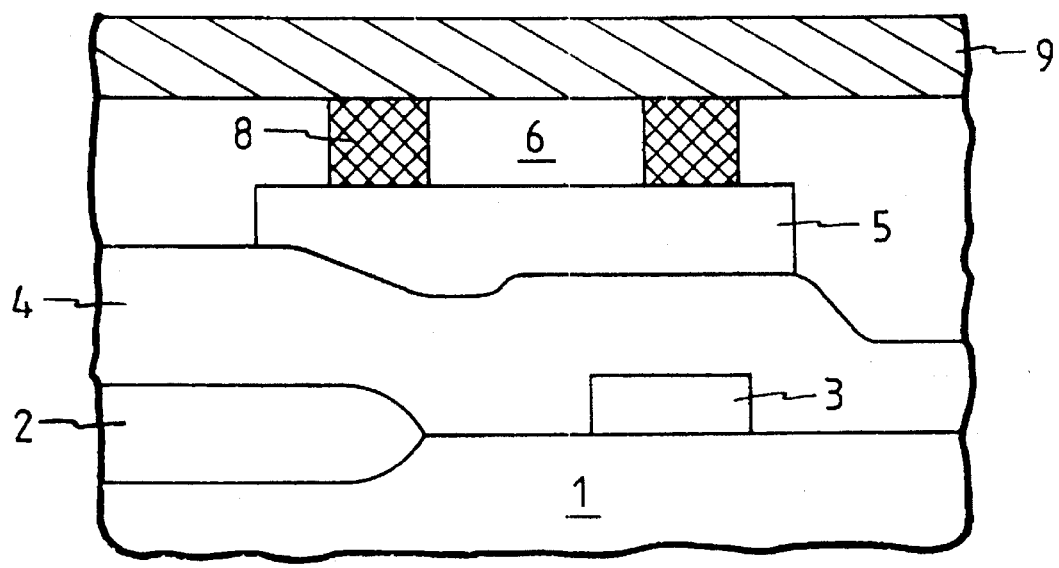

The photoresist film pattern 7 is then removed, as shown in FIG. 5. Thereafter, the contact holes are filled with tungsten to form tungsten plugs 8 respectively buried in the contact holes using a deposition process over the entire exposed surface of the resulting structure, a second metal layer 9 comprised of, for example, an Al alloy layer is then deposited. The deposition of the tungsten filling the contact holes is carried out at a deposition temperature of 250° to 400° C. in a low pressure chemical vapor deposition (LPCVD) reactor which uses a reacting gas consisting of $WF_6$ and $H_2$ (or $SiH_4$). On the other hand, the deposition of the second metal layer is carried out using the well-known sputtering process. As mentioned above, the tungsten deposition time can be reduced because a seed layer for the tungsten growth has been formed by a reaction between the silicon and the aluminum alloy layer. By virtue of the reduced tungsten deposition time, the tungsten reaction temperature can be maintained at a relatively low value. Even though the second oxide film is comprised of the SOG film, such a relatively low temperature value makes it possible to achieve the tungsten deposition without any generation of gas adversely affecting the tungsten deposition from the SOG film.

As apparent from the above description, it is possible to remove the F-based polymer formed of via contact holes by an implantation of silicon ions in accordance with the present invention. The present invention also prevents a direct reaction between Al and $WF_6$ and thus inhibits formation of $AlF_3$ resulted from the reaction. This makes it possible to decrease the contact resistance. Thus, a semiconductor device exhibiting a good performance can be obtained.

Since the reaction between Si ad $Wf_6$ can be achieved even at a low temperature of, for example, no more than 300° C., any gas generation from the SOG film sensitive to temperature is prevented. Moreover, the reaction between Si and $WF_6$ at the low temperature makes it possible to provide a seed layer for W growth formed by a bonding of Si and $WF_6$. Such a seed layer reduces the latent time of W to be grown over the first metal layer.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a tungsten contact plug, comprising the steps of:

(a) forming an inter-device isolation insulating film as a first insulating layer on a substrate, forming a polysilicon pattern on a portion of said first insulating layer, forming a first oxide film on an entire exposed surface of the polysilicon pattern and another portion of the first insulating layer, depositing a Al layer on a portion of said first oxide film, forming a second insulating layer on an entire exposed surface of the Al layer and another portion of said first oxide film, and etching a portion of said second insulating layer with a flourine-based reacting gas to form a via contact hole through which the Al layer is partially exposed;

(b) implanting silicon ions in a bottom surface of said via contact hole to remove a fluorine-based based polymer formed on the via contact hole and on an upper surface of said Al layer as a part of said step of forming the via contact hole and to form a seed layer for tungsten growth;

(c) depositing tungsten to form a tungsten plug buried in the via contact hole; and (d) depositing a metal layer over an entire exposed surface of resulting structure so that said metal layer is in contact with the Al layer via said tungsten plug.

2. A method in accordance with claim 1, wherein said step of depositing tungsten is carried out at a deposition temperature of 250° to 400° C. in a low pressure chemical vapor deposition reactor using a reacting gas consisting of $WF_6$ and one of $H_2$ and $SiH_4$.

3. A method in accordance with claim 1, wherein said step of implanting silicon ions is carried out under a condition of using an energy of 20 to 30 Key and a dose of $10^{14}$ to $10^{15}$ Ions/cm$^2$.

4. A method in accordance with claim 1, wherein said second oxide film is comprised of an inter-metal oxide film or a spin-on-glass film.

5. A method in accordance with claim 2, wherein said second oxide film is comprised of a spin-on-glass film and said step of depositing tungsten is carried out at a deposition temperature inhibiting a generation of gas from said spin-on-glass film.

* * * * *